United States Patent [19]
Kawamoto

[11] Patent Number: 5,659,249
[45] Date of Patent: Aug. 19, 1997

[54] SEMICONDUCTOR MAGNETIC-TO-ELECTRIC CONVERTER WITH HALL DEVICE HAVING IMPROVED TEMPERATURE CHARACTERISTICS

[75] Inventor: Atsunobu Kawamoto, Tokyo, Japan

[73] Assignee: Mitsubishi Denki Kabushiki Kaisha, Tokyo, Japan

[21] Appl. No.: 572,611

[22] Filed: Dec. 14, 1995

[30] Foreign Application Priority Data

Aug. 17, 1995 [JP] Japan ..................... 7-209570

[51] Int. Cl.$^6$ ............ H01L 43/06; G01R 33/02; G01N 27/72
[52] U.S. Cl. .............. 324/251; 324/225; 338/32 H; 327/511
[58] Field of Search ................ 324/251, 252, 324/225, 207.12; 330/32 H, 32 R; 327/510, 511

[56] References Cited

U.S. PATENT DOCUMENTS 4,833,406  5/1989  Foster ........................ 324/251

*Primary Examiner*—Walter E. Snow

[57] ABSTRACT

A semiconductor magnetic to electric converter includes a Hall device, a differential amplifier for differentially amplifying an output voltage of the Hall device, a constant-current circuit forming a constant current source to the differential amplifier and an amplifier for amplifying an output of the differential amplifier. A current to voltage conversion resistor of the constant-current circuit is set to have a temperature characteristic capable of canceling a temperature characteristic of an intrinsic input resistance of the Hall device. Furthermore, the temperature characteristics of a set resistor for setting a current value of the constant current circuit, load resistors included in the differential amplifier and a load resistor of the amplifier are set to cancel out each other.

8 Claims, 5 Drawing Sheets

SEMICONDUCTOR MAGNETIC-TO-ELECTRIC CONVERTER WITH HALL DEVICE HAVING IMPROVED TEMPERATURE CHARACTERISTICS

BACKGROUND OF THE INVENTION

1. Field of the Invention

The present invention relates to semiconductor magnetic-to-electric converters that measure the intensity of a magnetic field by means of Hall a effect device element and is particularly concerned with improvements in the dependency of their output characteristics on temperature.

2. Description of the Related Art

A Hall device is a device that produces a voltage proportional to the intensity of an applied magnetic field and is used as a sensing element that converts magnetic flux density to voltage. A Hall device and a signal processing circuit can be formed on a single semiconductor substrate, so that the resulting one-chip IC has been used as a semiconductor magnetic-to-electric converter.

FIG. 5 shows an exemplary circuit of a prior Hall IC. In FIG. 5, a Hall IC 1 comprises a Hall element 2, a differential amplifier that is composed of two NPN transistors Q1, Q2 and two resistors R1, R2 and performs differential amplification of an output voltage from Hall element 2, a constant-current circuit that comprises five NPN transistors Q3, Q4, Q8, Q10, Q11, four PNP transistors Q5, Q6, Q7, Q9, and two resistors R4, R5 and provides a constant current to the differential amplifier, and an amplifier that comprises two buffer circuits 12, 15, an operational amplifier 14, two NPN transistors Q17, Q18, and three resistors R13, R16, R19 and amplifies the output voltage of the differential amplifier to output the result.

Hall device 2 is mounted on a semiconductor substrate using an epitaxial layer and has input terminals 2a, 2b, through which an external power is supplied, and output terminals 2c, 2d, through which a voltage signal proportional to the intensity of a magnetic field is output. The base of NPN transistor Q1 is connected to output terminal 2c, and the base of NPN transistor Q2 is connected to output terminal 2d. An external regulated power supply, which is called external power supply hereafter, is applied to input terminal 2a to provide source voltage Vcc, and input terminal 2b is grounded.

The collector of NPN transistor Q1 is connected to the external power supply through resistor R1, which is a base-diffused resistor, and the collector of NPN transistor Q2 is connected to the external power supply through resistor R2, which is a base-diffused resistor. The emitters of NPN transistors Q1 and Q2 are connected to each other, and the connection is also connected to the collector of NPN transistor Q3. This NPN transistor Q3 and NPN transistor Q4 form a current mirror. The bases of NPN transistors Q3 and Q4 are connected to each other, and the connection is also connected to the collector of NPN transistor Q4. Further, the emitters of NPN transistors Q3 and Q4 are grounded.

The constant-current circuit that comprises PNP transistors Q5, Q6, Q7, Q9, NPN transistors Q8, Q10, Q11, resister R4, which is a base-diffused resister, and resister R5, which is a base-diffused resistor, provides a current source to the current mirror formed by NPN transistors Q3 and Q4. Also, PNP transistors Q5, Q6, Q7 form a current mirror, and NPN transistors Q10, Q11 form another current mirror. The emitters of PNP transistors Q5, Q6, Q7 and the collector of NPN transistor Q8 are connected to the external power supply. The bases of PNP transistors Q5, Q6, Q7 and NPN transistor Q8 are connected to each other, and the connection is connected to the emitter of NPN transistor Q9.

The emitter of NPN transistor Q8 is grounded through resistor R4, and the collector of PNP transistor Q9 is also grounded. The bases of NPN transistors Q10 and Q11 are connected to each other, and the connection is connected to the collector of NPN transistor Q10. Further, the emitter of NPN transistor Q10 is grounded, and the emitter of NPN transistor Q11 is grounded through resistor R5. The collector of PNP transistor Q5 is connected to the collector of NPN transistor Q10. The collector of PNP transistor Q6 is connected to the base of PNP transistor Q9, and the connection is connected to the collector of NPN transistor Q11.

The collector of PNP transistor Q7 is connected to the collector of NPN transistor Q4 and provides a current to the current mirror formed by NPN transistors Q3 and Q4. The connection between resistor R1 and the collector of NPN transistor Q1 is connected to the input terminal of buffer circuit 12, and the output terminal of buffer circuit 12 is connected to the−input terminal of operational amplifier 14 through resistor R13, which is a base-diffused resistor. The connection between resistor R2 and the collector of NPN transistor Q2 is connected to the input terminal of buffer circuit 15, and the output terminal of buffer circuit 15 is connected to the + input terminal of operational amplifier 14 through resistor R16, which is a base-diffused resistor.

The output terminal of operational amplifier 14 is connected to the bases of NPN transistors Q17 and Q18, and the collector of NPN transistor Q17 is connected to the + input terminal of operational amplifier 14. The collector of NPN transistor Q18 is connected to the connection between the output terminal of buffer circuit 12 and resistor 13. The emitters of NPN transistors Q17 and Q18 are connected to each other, and the connection is grounded through resistor R19, which is a resistor formed by using an epitaxial layer and called hereafter epi-resistor. The connection between the emitters of NPN transistors Q17, Q18, connected to resistor R19, is the output terminal of the Hall IC 1.

In the above circuitry, if a magnetic field is applied to Hall device 2, then a Hall voltage VH proportional to the intensity of the applied magnetic field occurs between the output terminals 2c and 2d of Hall device 2. The Hall voltage VH can be expressed by the following equation (1).

$$VH = KH \times (iH + B/d) \times fH \qquad (1)$$
$$= KH \times (Vcc/Rin) \times (B/d) \times fH,$$

where VH is the Hall voltage, KH is the Hall coefficient, iH is the driving current for the Hall device, B is the magnetic flux density, d is the thickness of Hall device 2, fH is a coefficient depending on the shape of Hall device 2, Vcc is an applied voltage provided by the power supply, and Rin is an input resistance of Hall device 2.

A difference between collector currents ia and ib that respectively flow through NPN transistors Q1 and Q2 occurs based on the Hall voltage VH. Specifically, if a magnetic field is applied in such a way as an electric potential at output terminal 2c of Hall device 2 becomes higher than an electric potential at output terminal 2d of Hall device 2, then the collector current ia becomes greater than the collector current ib. Consequently, the voltage drop in resistor R1 becomes greater than the voltage drop in resistor R2, so that the input voltage of buffer circuit 15 becomes higher than the input voltage of buffer circuit 12, and hence the output voltage of buffer circuit 12 becomes lower than the output voltage of buffer circuit 15.

However, since the electric potentials at the two input terminals of operational amplifier 14 can be regarded as equal, a current ioa corresponding to the difference between the output voltages of buffer circuits 12 and 15 flows through resistor R16, which is located between buffer circuit 15 and the + input terminal of operational amplifier 14, in the direction such that a current flows into the collector of NPN transistor Q17. Further, since the input voltage at the + input terminal of operational amplifier 14 is greater than the input voltage at the − input terminal of operational amplifier 14, the electric potential at the output terminal of operational amplifier 14 becomes positive, and hence NPN transistor Q17 is set on, so that the current ioa flows into resistor R19 through NPN transistor Q17. At the same time, since NPN transistor Q18 is also set on, the current iob from buffer circuit 12 also flows into resistor R19 through NPN transistor Q18. The voltage generated in this way by the currents ioa and iob flowing into resistor R19 becomes an output voltage Vo of the Hall IC 1.

If the potential difference between the input terminals of buffer circuits 12 and 15 is ΔV, then $$ioa = \Delta V / R16, \qquad (2)$$

where R16 denotes the resistance value of resistor R16 as in subsequent equations.

The current ioa is the collector current of NPN transistor Q17, and the current iob is the collector current of NPN transistor Q18. NPN transistors Q17 and Q18 have the same current-amplification factor, and the values of their base currents are the same, since both currents are the same current output from operational amplifier 14. Therefore, ioa=iob.

The above ioa and iob are proportional to the above Hall voltage VH, so that if the proportional constant is α, the above output voltage Vo becomes $$\begin{aligned} Vo &= (ioa + iob) \times R19 \times \alpha \times VH \qquad (3)\\ &= 2 \times ioa \times R19 \times \alpha \times VH \\ &= 2 \times (\Delta V / R16) \times R19 \times \alpha \times VH, \end{aligned}$$

where R19 denotes the resistance value of resistor R19 as in subsequent equations.

According to the above equations (1) and (3), the temperature characteristic of resistor R19 can be canceled out by the temperature characteristic of the input resistance Rin of Hall element 2, but the temperature characteristic of 1/R16 can not be compensated. Therefore, temperature compensation has not been sufficiently achieved for the Hall IC.

SUMMARY OF THE INVENTION

An object of the present invention is therefore to solve the above problem and to obtain a semiconductor magnetic-to-electric converter such that the performance of temperature compensation is improved over prior ones.

In order to achieve the aforementioned objective, there is provided a of semiconductor magnetic-to-electric converter comprising a Hall device, a differential amplifier that amplifies an output voltage of the Hall device, a constant-current circuit that provides a constant-current source to the differential amplifier, and an amplifier that amplifies the output voltage of the differential amplifier. The present invention not only lets the temperature characteristic of the input resistance of the Hall element cancel out the temperature characteristic of the current-to-voltage conversion resistor, which is a component of the current-to-voltage conversion circuit at an output stage of the amplifier, but also makes a load resistor of the differential amplifier, the setting resistor that sets the value of the constant current of the constant-current circuit, and a load resistor of the amplifier cancel out each other. In contrast, prior converters have made only the temperature characteristic of the input resistance of the Hall element cancel out the temperature characteristic of the current-to-voltage conversion resistor.

According to one aspect of the present invention in the above kind of magnetic-to-electric-converter, the load resistor of the differential amplifier is a resistor obtained by reducing the diffusion density of a base-diffused resistor to increase its sheet resistivity. Further, the setting resistor of the constant-current circuit and the load resistor of the amplifier are base-diffused resistors. The temperature characteristic of the setting resistor of the constant-current circuit is canceled out by the temperature characteristics of the load resistor of the differential amplifier and the load resistor of the amplifier. For example, in the output voltage of the magnetic-to-electric converter, if the setting resistor shows a negative temperature characteristic, the present invention makes the load resistor of the differential amplifier and the setting resistor have a positive temperature characteristic to cancel it out.

According to another aspect of the present invention in the above kind of magnetic-to-electric converter, the load resistor of the amplifier is a thick-film resistor, and the load resistor of the differential amplifier and the setting resistor of the constant-current circuit are the same kind of diffused resistor. For example, if the semiconductor magnetic-to-electric converter is constructed as a hybrid IC, the load resistor of the amplifier is made to be a thick-film resistor on a thick-film substrate, so that it has no temperature characteristic, and the temperature characteristic of the differential amplifier is canceled out by the temperature characteristic of the setting resistor of the constant-current circuit.

According to another aspect of the present invention in the above kind of magnetic-to-electric converter, the setting resistor of the constant-current circuit is a thick-film resistor, and the load resistor of the differential amplifier and the load resistor of the amplifier are the same kind of diffused resistor. For example, if the semiconductor magnetic-to-electric converter is constructed as a hybrid IC, the setting resistor of the constant-current circuit is made to be a thick-film resistor on a thick-film substrate, so that it has no temperature characteristic, and the temperature characteristic of the load resistor of the differential amplifier is canceled out by the temperature characteristic of the load resistor of the amplifier.

In a second kind of semiconductor magnetic-to-electric converter comprising a Hall element, a differential amplifier that performs differential amplification of the output voltage of the Hall element, a constant-current circuit that provides a constant-current source to the differential amplifier, an amplifier that amplifies the output voltage of the differential amplifier, and an output circuit that controls the output voltage of the amplifier, the present invention not only lets the temperature characteristic of the input resistance of the Hall element cancel out the temperature characteristic of the current-to-voltage conversion resistor, which is a component of the current-to-voltage conversion circuit at the output stage of the amplifier, but also eliminates the load resistor of the amplifier and makes the temperature characteristic of the output circuit and the temperature characteristic of the setting resistor of the constant-current circuit cancel out each other. In contrast, prior converters have made only the temperature characteristic of the input resistance of the Hall element cancel out the temperature characteristic of the current-to-voltage conversion resistor.

According to one aspect of the present invention in the above second kind of magnetic-to-electric converter, the output circuit comprises a comparator and a reference-voltage source that generates a reference voltage for the comparator, and the temperature characteristic of the setting resistor of the constant-current circuit is canceled out by the temperature characteristic of the reference-voltage source. The temperature characteristic of the reference-voltage source is made inversely proportional to the temperature characteristic of the setting resistor of the constant-current circuit, so that the temperature characteristic of the output circuit and the temperature characteristic of the setting resistor of the constant-current circuit are canceled out by each other.

According to another aspect of the present invention in the above second kind of magnetic-to-electric converter, the setting resistor of the constant-current circuit is a thick-film resistor, and the output circuit has no temperature characteristic. For example, if the semiconductor magnetic-to-electric converter is constructed as a hybrid IC, the setting resistor of the constant-current circuit is made to be a thick-film resistor on a thick-film substrate, so that it has no temperature characteristic, and the temperature characteristic of the output circuit is also made to have no temperature characteristic.

According to another aspect of the present invention in the above second kind of magnetic-to-electric converter, the output circuit comprises a comparator and a reference-voltage source that generates a reference voltage for the comparator, and the reference-voltage source is composed of a plurality of thick-film resistors that generate the reference voltage by dividing the power-supply voltage provided from the outside. For example, if the semiconductor magnetic-to-electric converter is constructed as a hybrid IC, the reference-voltage source of the output circuit is composed of thick-film resistors, so that the output circuit can be made to have no temperature characteristic.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

The preferred embodiments according to the present invention will be described below with reference to the attached drawings.

Figure 1:
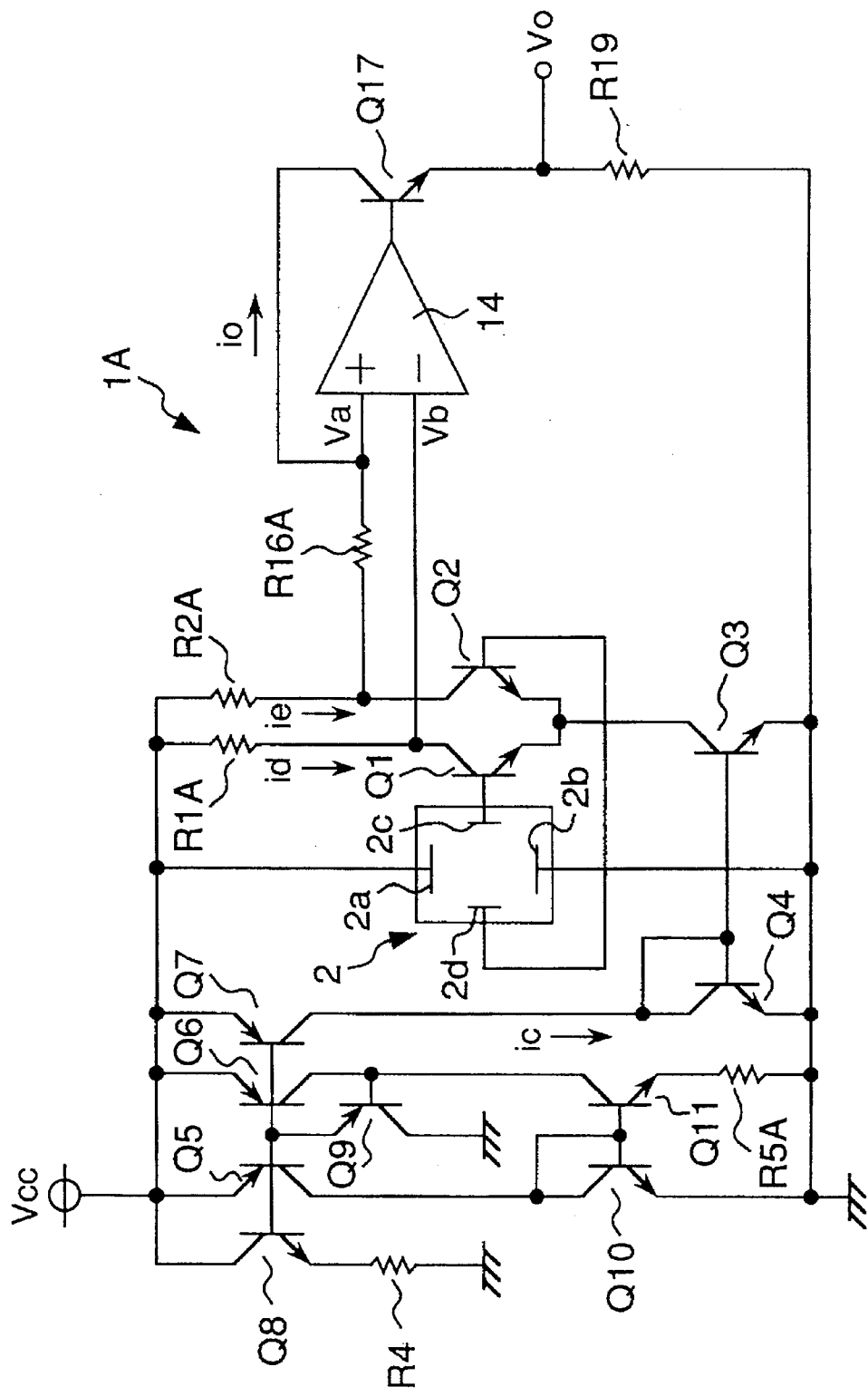
FIG. 1 shows the circuit of an exemplary Hall IC in a first embodiment in accordance with the present invention.
Figure 5:
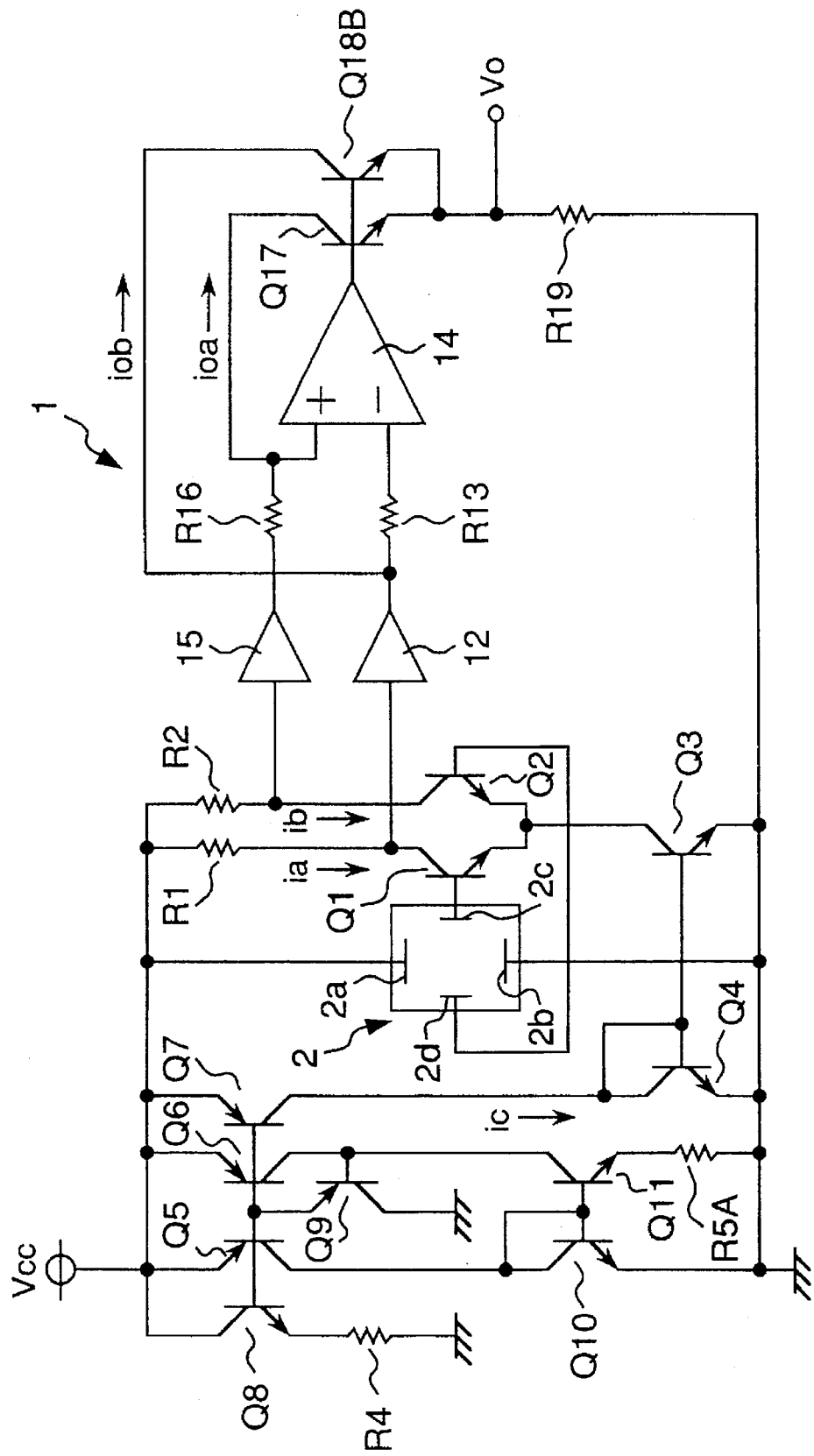
FIG. 5 shows the circuit of an exemplary prior Hall IC.

FIG. 1 shows the circuit of an exemplary Hall IC in a first embodiment in accordance with the present invention. The same components as in FIG. 5 are denoted by the same symbols.

In FIG. 1, the Hall IC 1A comprises a Hall device 2, a differential amplifier that is composed of two NPN transistors Q1, Q2 and two resistors R1A, R2A and performs differential amplification of an output voltage from Hall device 2, a constant-current circuit that comprises five NPN transistors Q3, Q4, Q8, Q10, Q11, four PNP transistors Q5, Q6, Q7, Q9, and two resistors R4, R5A and provides a constant current to the differential amplifier, and an amplifier that comprises an operational amplifier 14, one NPN transistor Q17, and two resistors R16A, R19 and amplifies the output voltage of the differential amplifier to output the result.

The above Hall IC is a semiconductor magnetic-to-electric converter. Resistors R1A and R2A are load resistors of the differential amplifier. Resistor R5A is a setting resistor that sets the constant-current value of the constant-current circuit. Resistor R16A is a load resistor of the amplifier, and resistor R19 is a current-to-voltage conversion resistor at the output stage of the amplifier.

Hall device 2 is mounted on a semiconductor substrate using an epitaxial layer and has input terminals 2a, 2b, through which external power is supplied, and output terminals 2c, 2d, through which a voltage signal proportional to an intensity of a magnetic field is output. The base of NPN transistor Q1 is connected to output terminal 2c, and the base of NPN transistor Q2 is connected to output terminal 2d. An external power supply is applied to input terminal 2a to provide a source voltage Vcc, and input terminal 2b is grounded.

The collector of NPN transistor Q1 is connected to the external power supply through resistor R1A, which is a resistor obtained by reducing the diffusion density of a base-diffused resistor to increase sheet resistivity and called hereafter high resistor. The collector of NPN transistor Q2 is connected to the external power supply through a high resistor R2A. Here the values of resistors R1A and R2A are the same. The emitters of NPN transistors Q1 and Q2 are connected to each other, and the connection is also connected to the collector of NPN transistor Q3. This NPN transistor Q3 and NPN transistor Q4 form a current mirror. The bases of NPN transistors Q3 and Q4 are connected to each other, and the connection is also connected to the collector of NPN transistor Q4. Further, the emitters of NPN transistors Q3 and Q4 are grounded.

The constant-current circuit that comprises PNP transistors Q5, Q6, Q7, Q9, NPN transistors Q8, Q10, Q11, and base-diffused resistors R4, R5A provides a current source to the current mirror formed by NPN transistors Q3 and Q4. Also, PNP transistors Q5, Q6, Q7 form a current mirror, and NPN transistors Q10, Q11 form another current mirror. The emitters of PNP transistors Q5, Q6, Q7 and the collector of NPN transistor Q8 are connected to the external power supply. The bases of PNP transistors Q5, Q6, Q7 and NPN transistor Q8 are connected to each other, and the connection is connected to the emitter of NPN transistor Q9.

The emitter of NPN transistor Q8 is grounded through resistor R4, and the collector of PNP transistor Q9 is also grounded. The bases of NPN transistors Q10 and Q11 are connected to each other, and the connection is connected to the collector of NPN transistor Q10. Further, the emitter of NPN transistor Q10 is grounded, and the emitter of NPN transistor Q11 is grounded through resistor R5A. The collector of PNP transistor Q5 is connected to the collector of NPN transistor Q10. The collector of PNP transistor Q6 is connected to the base of PNP transistor Q9, and the connection is connected to the collector of NPN transistor Q11.

The collector of PNP transistor Q7 is connected to the collector of NPN transistor Q4 and provides a constant current ic to the current mirror formed by NPN transistors Q3 and Q4. A connection between resistor R1A and the collector of NPN transistor Q1 is connected to a − input terminal of operational amplifier 14. A connection between resistor R2A and the collector of NPN transistor Q2 is connected to a + input terminal of operational amplifier 14 through resistor R16A, which is a base-diffused resistor.

An output terminal of operational amplifier 14 is connected to the base of NPN transistor Q17, and the collector of NPN transistor Q17 is connected to a + input terminal of operational amplifier 14. The emitter of NPN transistor Q17 is grounded through resistor R19, which is an epi-resistor. A connection between the emitter of NPN transistor Q17 and resistor R19 is an output terminal of the Hall IC 1.

In the above circuitry, if a magnetic field is applied to Hall device 2, then a Hall voltage VH proportional to an intensity of the applied magnetic field occurs between the output terminals 2c and 2d of Hall device 2. The Hall voltage VH can be expressed by the above equation (1).

If the ratio of the emitter area of NPN transistor Q10 to the emitter area of NPN transistor Q11 is 1: N, that is, if the current-amplification factor of Q11 is N times the current-amplification factor of Q10, then the above constant current ic is expressed by $$ic = VT \times \ln N / R5A \quad (4)$$

where R5A is the resistance value of resistor R5A, and VT is expressed by $$VT = k \times T/q,$$

where k is Boltzmann's constant, q is the electric charge of an electron, and T is an absolute temperature. In particular, if T=300° K. then VT≈0.026 (V).

A difference between collector currents id and ie that respectively flow through NPN transistors Q1 and Q2 occurs based on the Hall voltage VH. Specifically, if a magnetic field is applied in such a way as an electric potential at output terminal 2c of Hall device 2 becomes higher than an electric potential at output terminal 2d of Hall device 2, then the collector current id becomes greater than the collector current ie, and their difference becomes as shown in the following equation (5).

$$id - ie = ic/2/VT \times VH \quad (5)$$
$$= \ln N/2/R5A \times VH,$$

where R5A is the resistance value of resistor R5A as in subsequent equations.

Now, assuming a voltage at the + input terminal of operational amplifier 14 is Va, a voltage at the − input terminal is Vb, and a current flowing through the collector of NPN transistor Q17 is io. Then $$Va = (ie + io) \times R2A + R16A \times io, \quad (6)$$

$$Vb = R1A \times id = R2A \times id, \quad (7)$$

where R2A is a resistance value of resistor R2A, R16A is a resistance value of resistor R16A, and R1A is a resistance value of R1A as in subsequent equations.

The electric potentials at the two input terminals of operational amplifier 14 can be regarded as equal, so that Va=Vb. Therefore, from the equations (6) and (7), it follows $$ie \times R2A + (R2A + R16A) \times io = R2A \times id,$$

that is, $$(R2A + R16A) \times io = R2A \times (id - ie).$$

Therefore, we obtain the following equation (8).

$$io = R2A/(R2A + R16A) \times (id - ie). \quad (8)$$

Further, substituting the right side of the equation (5) for (id−ie) in the equation (8), we obtain $$io = R2A/(R2A + R16A) \times (\ln N/2/R5A \times VH). \quad (9)$$

Therefore, the output voltage Vo of Hall IC 1A is expressed by the following equation (10).

$$\begin{aligned} Vo &= io \times R19 \\ &= R2A/(R2A + R16A) \times (\ln N/2/R5A \times VH) \times R19. \end{aligned} \quad (10)$$

In general, as for the above base-diffused resisters, their sheet resistivities are between 100 and 200 Ω/□, variances of their resistance values are ±20%, and their temperature coefficients are between +1500 and +2000 ppm/° C. As for the above epi-resistor, its sheet resistivity is between 2 and 5 kΩ/□, the variance of its resistance value is ±50%, and its temperature coefficient is +7000 ppm/° C. As for the above high resisters, their sheet resistivity is 1 kΩ/□, the variance of their resistance value is ±25%, and their temperature coefficient is +4000 ppm/° C. The temperature characteristic of the input resistance Rin of Hall device 2 is canceled out by the temperature characteristic of resistor R19. Therefore, if R2A is a high resistor, and if resistors R5A and R16A are base-diffused resistors, temperature compensation for the output voltage Vo can be achieved by combining the temperature characteristics of these resistors based on the equation (10). Specifically, 1/R5A is made to show a negative temperature characteristic, and R2A/(R2A+R16A) is made to show a positive temperature characteristic to cancel that negative temperature characteristic. If resistor R2A is made to be a high resistor, resistor R1A should also be a high resistor.

Further, if Hall IC 1A is constructed as a hybrid IC, resistor R16A is made to be a thick-film resistor having almost no temperature characteristic on a thick-film substrate, and resistors R2A and R5A are made to be the same kind of base-diffused resistor. Then temperature compensation for the output voltage Vo in the Hall IC 1A can be achieved based on the equation (10). Further, if resistor R5A is made to be a thick-film resistor having almost no temperature characteristic on a thick-film substrate, and resistors R2A and R16A are made to be the same kind of base-diffused resistor, then temperature compensation for the output voltage Vo in the Hall IC 1A can also be achieved based on the equation (10).

Figure 2:
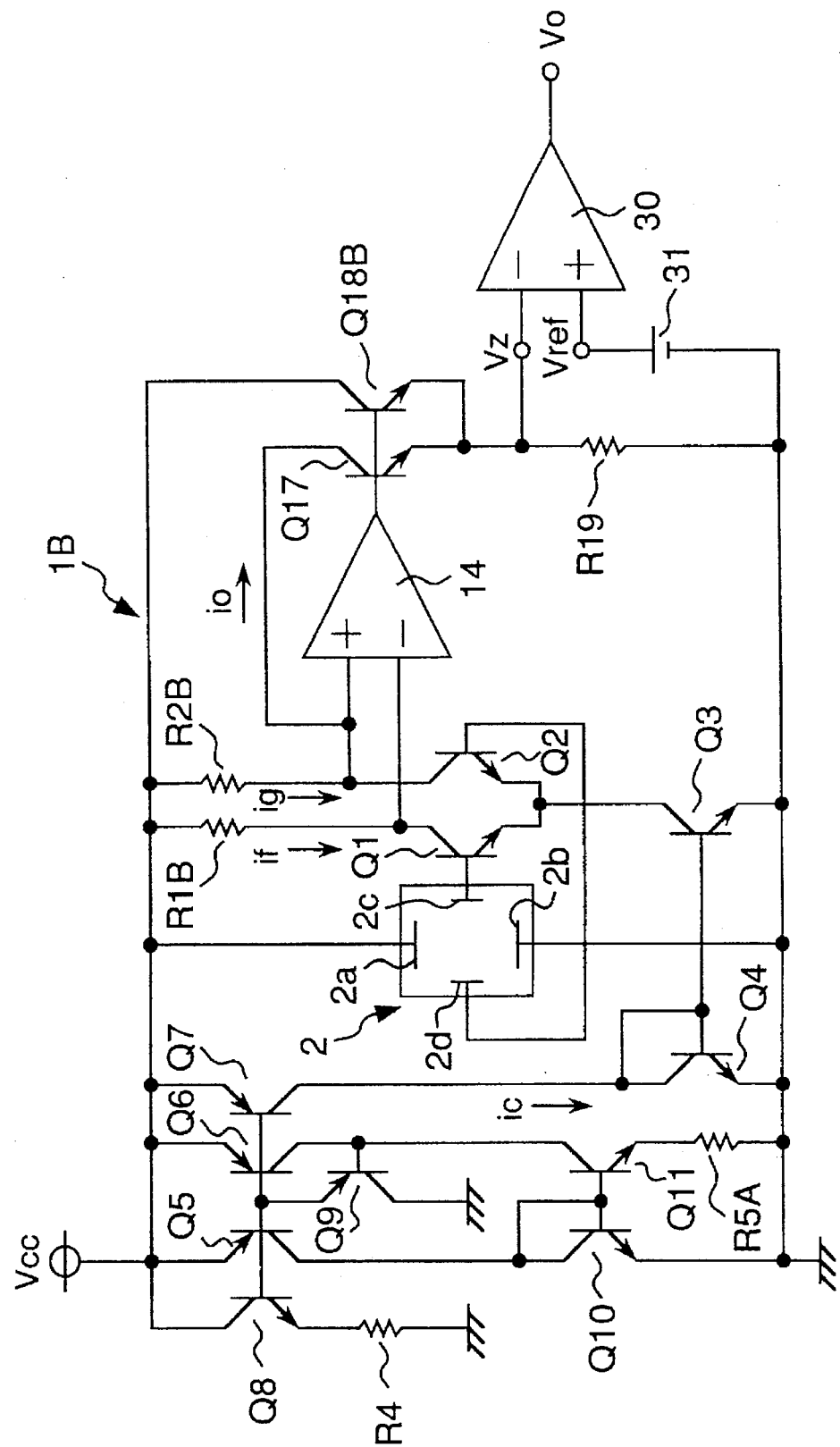
FIG. 2 shows an exemplary circuit of Hall IC in a second embodiment in accordance with the present invention.

FIG. 2 shows an exemplary circuit of Hall IC in a second embodiment in accordance with the present invention. The same components as in FIG. 1 are denoted by the same symbols, their descriptions are omitted, and only the part of construction and operation different from the first embodiment is described in the following.

The construction of the second embodiment is different from the first embodiment in that the resistors R1A and R2A of FIG. 1 are respectively changed into resistors R1B and R2B, the resistor R16A of FIG. 1 is abolished by a short-circuit, an NPN transistor Q18B and a comparator 30 are added, and a reference-voltage source 31 that generates a reference voltage Vref for comparator 30 is added. The resulting Hall IC is now denoted by 1B.

In FIG. 2, the Hall IC 1B comprises a Hall device 2, a differential amplifier that comprises two NPN transistors Q1, Q2 and two resistors R1B, R2B and performs differential amplification of the output voltage of Hall element 2, a constant-current circuit that comprises five NPN transistors Q3, Q4, Q8, Q10, Q11, four PNP transistors Q5, Q6, Q7, Q9, and two resistors R4, R5A and provides a constant-current source to the differential amplifier, an amplifier that comprises an operational amplifier 14, two NPN transistors Q17, Q18B, and one resistor R19 and amplifies an output voltage of the differential amplifier to output the result, and an output circuit that comprises a comparator 30 and a reference-voltage source 31 and controls an output voltage of the amplifier.

The above Hall IC 1B is a semiconductor magnetic-to-electric converter. Resistors R1B and R2B are load resistors of the differential amplifier. Resistor R5A is a setting resistor that sets the constant-current value of the constant-current circuit. Resistor R19 is the current-to-voltage conversion resistor at the output stage of the amplifier.

The collector of NPN transistor Q1 is connected to the external power supply through resistor R1B, which is a base-diffused resistor. The collector of NPN transistor Q2 is connected to the external power supply through resistor R2B, which is a base-diffused resistor. The connection between resistor R1B and the collector of NPN transistor Q1 is connected to an − input terminal of operational amplifier 14, and a connection between resistor R2B and the collector of NPN transistor Q2 is connected to a + input terminal of operational amplifier 14.

The output terminal of operational amplifier 14 is connected to the bases of NPN transistors Q17 and Q18B, and the collector of NPN transistor Q17 is connected to a + input terminal of operational amplifier 14. The collector of NPN transistor Q18B is connected to the external power supply. The emitters of NPN transistors Q17 and Q18B are connected to each other, and a connection is grounded through resistor R19, which is an epi-resistor. A connection between the emitters of NPN transistor Q17, Q18B and resistor R19 is connected to a − input terminal of comparator 30, and reference-voltage source 31 is inserted between a + input terminal of the comparator 30 and the ground. The output terminal of comparator 30 is an output terminal of the Hall IC 1B.

In the above circuitry, if a magnetic field is applied to Hall device 2, then a Hall voltage VH proportional to the intensity of the applied magnetic field occurs between the output terminals 2c and 2d of Hall device 2. The Hall voltage VH can be expressed by the above equation (1). The constant current ic is expressed by the equation (4). A difference between collector currents if and ig that respectively flow through NPN transistors Q1 and Q2 occurs based on the Hall voltage VH. Specifically, if a magnetic field is applied in such a way as an electric potential at output terminal 2c of Hall device 2 becomes higher than an electric potential at output terminal 2d of Hall device 2, then a collector current if becomes greater than a collector current ig, and their difference io becomes as shown in the following equation (11).

$$Io = if - ig \quad (11)$$
$$= ic/2/VT \times VH$$
$$= \ln N/2/R5A \times VH.$$

If the ratio of the emitter area of NPN transistor Q17 to the emitter area of NPN transistor Q18B is 1: M, that is, if the current-amplification factor of Q18B is M times the current-amplification factor of Q17, then a voltage at the connection between the emitters of NPN transistor Q17, Q18B and resistor R19, that is, the voltage Vz at an-input terminal of comparator 30, can be expressed by the following equation (12).

$$Vz = io \times (1 + M) \times R19 \quad (12)$$
$$= \ln N/2/R5A \times (1 + M) \times VH \times R19.$$

The temperature characteristic of resistor R19 is canceled out by the temperature characteristic of the input resistance Rin of Hall device 2, so that, based on the equation (12), the voltage Vz is inversely proportional to the temperature characteristic of resistor 5A. Therefore, if reference-voltage source 31 is made to have a temperature characteristic inversely proportional to a temperature characteristic of the same kind of base-diffused resistor as resistor R5A, then temperature compensation for the output voltage Vo of the Hall IC 1B can be achieved.

Figure 3:
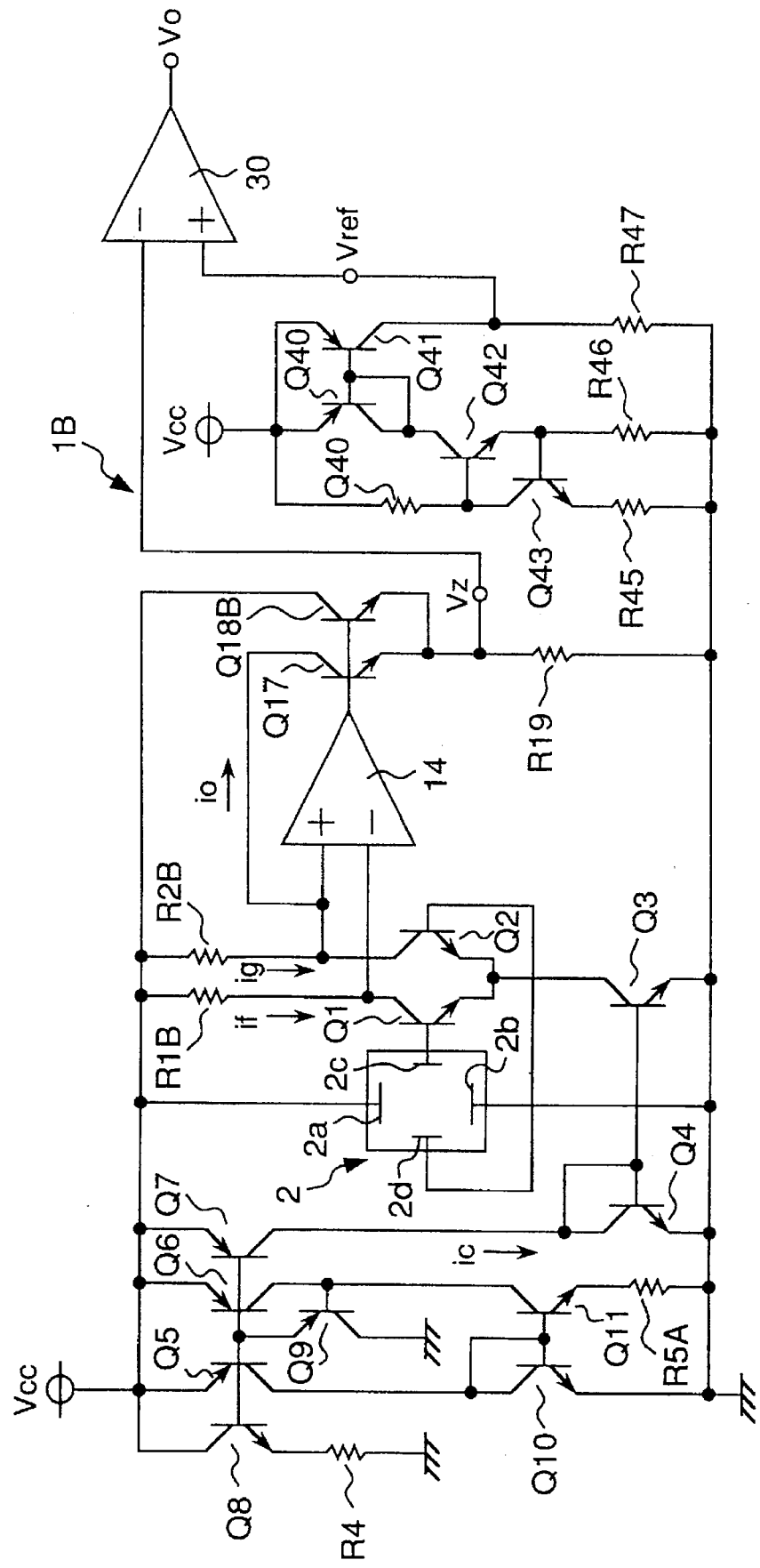
FIG. 3 shows an exemplary circuit of the reference-voltage source 31 in FIG. 2.

FIG. 3 shows an exemplary circuit of the reference-voltage source 31 in the circuit of Hall IC 1B shown in FIG. 2. The same components shown in FIG. 2 are denoted by the same symbols, their descriptions are omitted, and only the construction and operation of reference-voltage source 31 are described in the following.

In FIG. 3, reference-voltage source 31 comprises two PNP transistors Q40, Q41, two NPN transistors Q42, Q43, and four base-diffused resistors R44, R45, R46, R47. PNP transistors Q40 and Q41 form a current mirror. The bases of PNP transistors Q40 and Q41 are connected to each other, and the connection is connected to the collector of PNP transistor Q40. The emitters of PNP transistors Q40 and Q41 are connected to the external power supply.

The collector of PNP transistor Q40 is connected to the collector of NPN transistor Q42, and the base of NPN transistor Q42 is connected to the external power supply through resistor R44. The latter connection is connected to the collector of NPN transistor Q43, and the emitter of NPN transistor Q43 is grounded through resistor R45. Further, the base of NPN transistor Q43 is connected to the emitter of NPN transistor Q42, and the connection is grounded through R46. The collector of PNP transistor Q41 is grounded through resistor R47, and a connection between PNP transistor Q41 and resistor R47 is an output terminal of reference-voltage source 31, and the output terminal is connected to a + input terminal of comparator 30, so that the reference voltage Vref is applied thereto.

In the above circuitry, if a voltage between the base and the emitter of NPN transistor Q43 is denoted by VBE, then the reference voltage Vref is expressed as in the following equation (13).

$$Vref = R47/R46 \times \quad (13)$$
$$\{R45/(R44 + R45) \times Vcc +$$
$$(R44 - R45)/(R44 + R45) \times VBE\},$$

where R44 is a resistance value of resistor R44, R45 is a resistance value of resistor R45, R46 is a resistance value of resistor R46, and R47 is a resistance value of resistor R47.

Resistors R44 to R47 are the same kind of base-diffused resistor, so that their temperature characteristics are canceled out by each other in the equation (13). Therefore, the temperature characteristic of the reference voltage Vref becomes the temperature characteristic of the voltage VBE. The temperature characteristic of VBE is −2 mV/° C. and inversely proportional to the temperature characteristic of resistor R5A, so that they can be canceled out. Therefore, temperature compensation for the output voltage Vo of the Hall IC 1B can be achieved.

In the Hall IC 1B of the above second embodiment, resistor R5A is made to be a base-diffused resistor. However, if the Hall IC 1B is constructed as a hybrid IC, the resistor R5A can be made to be a thick-film resistor. In this case, it is necessary that the above reference-voltage source 31 should not have any temperature characteristic. The following third embodiment realizes this objective.

Figure 4:
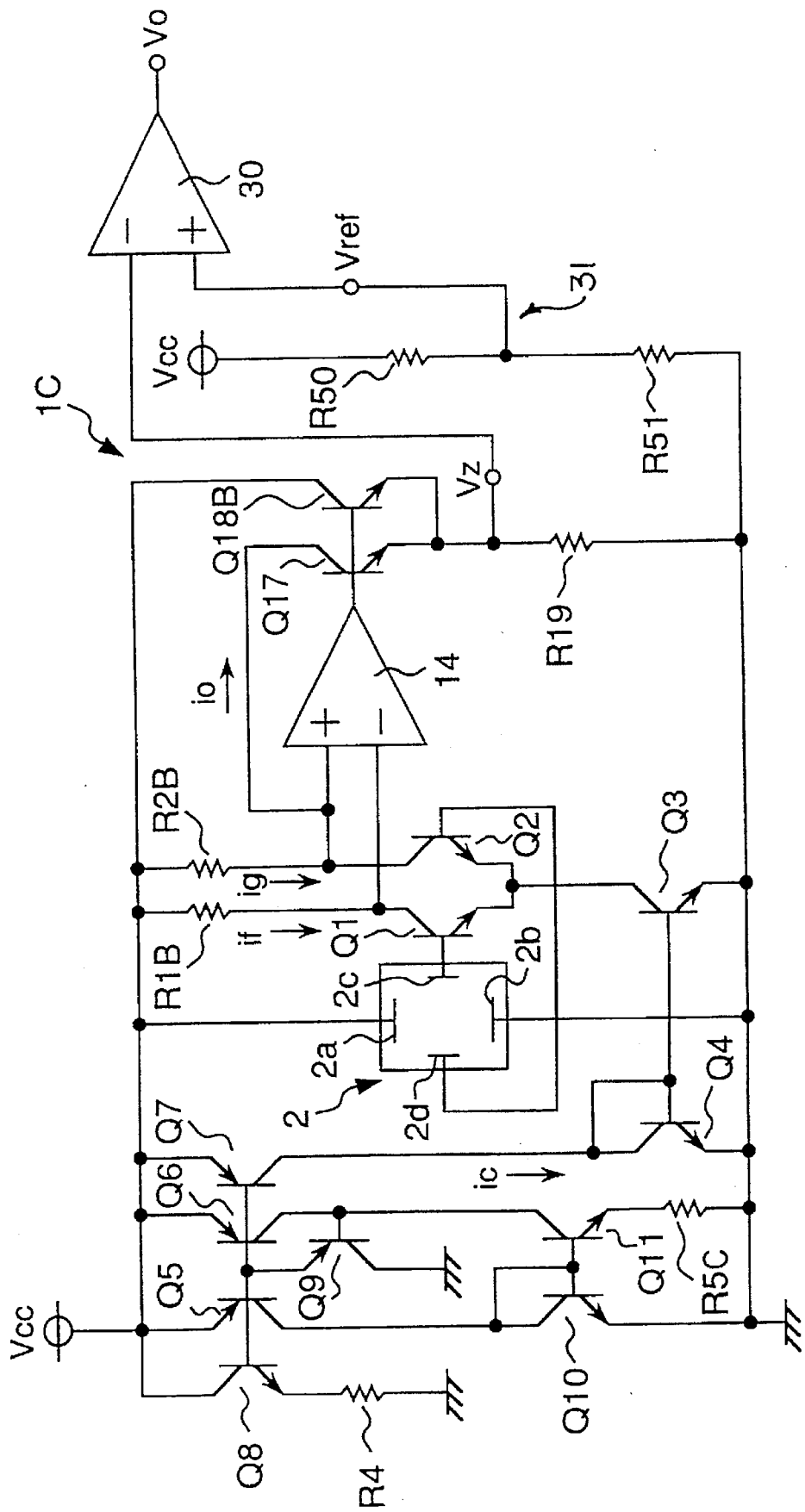
FIG. 4 shows the circuit of an exemplary Hall IC in a third embodiment in accordance with the present invention.

FIG. 4 shows the circuit of an exemplary Hall IC in the third embodiment in accordance with the present invention. The same components as in FIG. 3 are denoted by the same symbols, their descriptions are omitted, and only the part of construction and operation different from FIG. 3 is described in the following.

The Hall IC of the third embodiment shown in FIG. 4 is different from the one shown in FIG. 3 in that the resistor R5A of FIG. 3 is changed into a thick-film resistor and denoted by R5C, and the reference voltage source 31 is composed by two thick-film resistors R50 and R51. The resulting Hall IC is referred to a Hall IC 1C.

In FIG. 4, the Hall IC 1C comprises a Hall device 2, a differential amplifier that comprises two NPN transistors Q1, Q2 and two resistors R1B, R2B and performs differential amplification of an output voltage of Hall device 2, a constant-current circuit that comprises five NPN transistors Q3, Q4, Q8, Q10, Q11, four PNP transistors Q5, Q6, Q7, Q9, and two resistors R4, R5C and provides a constant-current source to the differential amplifier, an amplifier that comprises an operational amplifier 14, two NPN transistors Q17, Q18B, and one resistor R19 and amplifies the output voltage of the differential amplifier to output the result, and an output circuit that comprises a comparator 30 and two resistors R50 and R51 and controls an output voltage of the amplifier.

The above Hall IC 1C is a semiconductor magnetic-to-electric converter. Resistors R1B and R2B are load resistors of the differential amplifier. Resistor R5C is a setting resistor that sets the constant-current value of the constant-current circuit. Resistor R19 is a current-to-voltage conversion resistor at the output stage of the amplifier.

Resistors R50 and R51 are connected in series, and a connection is connected to a + input terminal of comparator 30. The other end of resistor R50 is connected to the external power supply, and the other end of resistor R51 is grounded. Reference-voltage source 31 provides a reference voltage Vref, which is generated by dividing the voltage Vcc of the external power supply by resistors R50 and R51, to the + input terminal of comparator 30.

If the Hall IC of the third embodiment is constructed as a hybrid IC, the temperature characteristic of the input resistance Rin in Hall device 2 is made to be canceled out by the temperature characteristic of resistor R19, and resistor R5C is made to be a thick-film resistor having almost no temperature characteristic on a thick-film substrate. Then the voltage Vz input to the − input terminal of comparator 30 becomes to have no temperature characteristic based on the equation (12). The reference voltage Vref input to the + input terminal of comparator 30 is also made to have no temperature characteristic by constructing reference-voltage source 31 using thick-film resistors. Therefore, temperature compensation for the output voltage Vo of the Hall IC 1C output from the output terminal of comparator 30 can be achieved.

In the above constructions of the second and third embodiment, the voltage Vz has been input to the − input terminal of comparator 30, and the reference voltage Vref has been input to the + input terminal of comparator 30. However, the voltage Vz can be input to the − input terminal. In that case, the voltage Vz should be input to the − input terminal. In this way, the present invention makes possible various changes and modifications. Such changes and modifications are to be understood as included within the scope of the present invention as defined by the appended claims unless they depart therefrom.

As is clear from the above descriptions, unlike prior technologies, the semiconductor magnetic-to-electric converter of the present invention not only makes the temperature characteristic of the input resistance of the Hall element cancel out the temperature characteristic of the current-to-voltage conversion resistor, which is a component of the current-to-voltage conversion circuit at the output stage of the amplifier, but also makes the load resistor of the differential amplifier, the setting resistor that sets the value of the constant current of the constant-current circuit, and the load resistor of the amplifier cancel out each other. Therefore, the present invention improves the performance of temperature compensation for the output voltage of semiconductor magnetic-to-voltage converters.

Further, according to the present invention, the temperature characteristic of the setting resistor of the constant-current circuit is canceled out by the temperature characteristics of the load resistor of the differential amplifier and the load resistor of the amplifier. For example, in the output voltage of the magnetic-to-electric converter, if the setting resistor shows a negative temperature characteristic, the present invention improves the performance of temperature compensation for the output voltage of semiconductor magnetic-to-voltage converters by making the load resistor of the differential amplifier and the setting resistor have a positive temperature characteristic to cancel it out.

Further, if the semiconductor magnetic-to-electric converter is constructed as a hybrid IC, the load resistor of the amplifier is made to be a thick-film resistor on a thick-film substrate, so that it has no temperature characteristic, and the temperature characteristic of the differential amplifier is canceled out by the temperature characteristic of the setting resistor of the constant-current circuit. In this way, the present invention improves the performance of temperature compensation for the output voltage of semiconductor magnetic-to-voltage converters.

Still further, if the semiconductor magnetic-to-electric converter is constructed as a hybrid IC, the setting resistor of the constant-current circuit is made to be a thick-film resistor on a thick-film substrate, so that it has no temperature characteristic, and the temperature characteristic of the load resistor of the differential amplifier is canceled out by the temperature characteristic of the load resistor of the amplifier. By this means, the present invention improves the performance of temperature compensation for the output voltage of semiconductor magnetic-to-voltage converters.

Further, unlike prior technologies, the semiconductor magnetic-to-electric converter of the present invention not only makes the temperature characteristic of the input resistance of the Hall element cancel out the temperature characteristic of the current-to-voltage conversion resistor, which is a component of the current-to-voltage conversion circuit at the output stage of the amplifier, but also eliminates the load resistor of the amplifier and makes the temperature characteristic of the output circuit and the temperature characteristic of the setting resistor of the constant-current circuit cancel out each other. Therefore, the present invention improves the performance of temperature compensation for the output voltage of semiconductor magnetic-to-voltage converters.

Further, the present invention makes the temperature characteristic of the reference-voltage source inversely proportional to the temperature characteristic of the setting resistor of the constant-current circuit, so that the temperature characteristic of output circuit and the temperature characteristic of the setting resistor of the constant-current circuit are canceled out by each other. By this means, the present invention improves the performance of temperature compensation for the output voltage of semiconductor magnetic-to-voltage converters.

Still further, if the semiconductor magnetic-to-electric converter is constructed as a hybrid IC, the setting resistor of the constant-current circuit is made to be a thick-film resistor on a thick-film substrate, so that it has no temperature characteristic, and the temperature characteristic of the output circuit is also made to have no temperature characteristic. By this means, the present invention improves the performance of temperature compensation for the output voltage of semiconductor magnetic-to-voltage converters.

Further, according to the present invention, if the semiconductor magnetic-to-electric converter is constructed as a hybrid IC, the reference-voltage source of the output circuit is composed of thick-film resistors, so that the output circuit can be made to have no temperature characteristic. By this means, the present invention improves the performance of temperature compensation for the output voltage of semiconductor magnetic-to-voltage converters.

What is claimed is:

1. A semiconductor magnetic-to-electric converter comprising:

a Hall device with an input resistance for outputting a voltage responsive to an external magnetic field applied;

a differential amplifier for differentially amplifying the voltage output from said Hall device, said differential amplifier having load resistors;

a constant current circuit forming a constant current source for said differential amplifier, said constant current circuit having a set resistor for setting a current value of said constant current circuit; and an amplifier for amplifying an output voltage of said differential amplifier, said amplifier having a current to voltage conversion resistor forming a current to voltage conversion circuit at an output stage of said differential amplifier and a load resistor set thereto;

wherein said current to voltage conversion resistor has a temperature characteristic capable of canceling a temperature characteristic of said input resistance of said Hall device, and temperature characteristics of said load resistors of said differential amplifier, said set resistor of said constant current circuit and said load resistor of said amplifier are set to cancel with each other.

2. The semiconductor magnetic-to-electric converter of claim 1 wherein said load resistors of said differential amplifier are resistors obtained by reducing the diffusion density of a base-diffused resistor to increase its sheet resistivity, and said set resistor of said constant-current circuit and said load resistor of said amplifier are base-diffused resistors.

3. The semiconductor magnetic-to-electric converter of claim 1 wherein said load resistor of said amplifier is a thick-film resistor, and said load resistors of said differential amplifier and the set resistor of said constant-current circuit are the same kind of diffused resistor.

4. The semiconductor magnetic-to-electric converter of claim 1 wherein said set resistor of said constant-current circuit is a thick-film resistor, and the load resistor of said differential amplifier and the load resistor of said amplifier are the same kind of diffused resistor.

5. A semiconductor magnetic-to-electric converter comprising:

a Hall device with an input resistance for outputting a voltage responsive to an external magnetic field applied;

a differential amplifier for differentially amplifying the voltage output from said Hall device, said differential amplifier having load resistors;

a constant current circuit forming a constant current source for said differential amplifier, said constant current circuit having a set resistor for setting a current value of said constant current circuit;

an amplifier for amplifying an output voltage of said differential amplifier, said amplifier having a current to voltage conversion resistor forming a current to voltage conversion circuit at an output stage of said differential amplifier and a load resistor set thereto; and an output circuit for controlling an output voltage amplified by said amplifier; wherein said current to voltage conversion resistor has a temperature characteristic capable of canceling a temperature characteristic of said input resistance of said Hall device, and a temperature characteristic of said output circuit and that of said set resistor of said constant current circuit are set to cancel with each other when said load resistor of said amplifier is short circuited.

6. The semiconductor magnetic-to-electric converter of claim 5 wherein said output circuit comprises a comparator and a reference-voltage source that generates a reference voltage for said comparator, and the temperature characteristic of said set resistor of said constant-current circuit is canceled out by the temperature characteristic of said reference-voltage source.

7. The semiconductor magnetic-to-electric converter of claim 5 wherein said set resistor of said constant-current circuit is a thick-film resistor, and said output circuit has no temperature characteristic.

8. The semiconductor magnetic-to-electric converter of claim 5 wherein said output circuit comprises a comparator and a reference-voltage source that generates a reference voltage for said comparator, and said reference-voltage source is composed of a plurality of thick-film resistors that generate the reference voltage by dividing the power-supply voltage provided from the outside.

* * * * *